(12) United States Patent
Yang et al.

(10) Patent No.: US 6,240,033 B1
(45) Date of Patent: May 29, 2001

(54) ANTIFUSE CIRCUITRY FOR POST-PACKAGE DRAM REPAIR

(75) Inventors: Woodward Yang; Joo Sun Choi, both of Ichon-shi; Jae Kyung Wee, Seoul; Young Ho Seol, Ichon-shi; Jin Keun Oh, Ichon-shi; Phil Jung Kim, Ichon-shi; Ho Youe Cho, Seoul, all of (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/479,665

(22) Filed: Jan. 10, 2000

Related U.S. Application Data
(60) Provisional application No. 60/115,377, filed on Jan. 11, 1999.

(51) Int. Cl.[7] .................................................... G11C 7/00
(52) U.S. Cl. ........................ 365/225.7; 365/200; 365/96; 257/50; 257/530
(58) Field of Search ............................ 365/225.7, 200, 365/96, 189.01; 257/50, 530

(56) References Cited

U.S. PATENT DOCUMENTS

| | | | |
|---|---|---|---|
| 5,301,159 | 4/1994 | Lee .................................... | 365/225.7 |
| 5,324,681 | 6/1994 | Lowrey et al. ...................... | 437/52 |
| 5,331,196 | 7/1994 | Lowrey et al. ...................... | 357/529 |
| 5,418,738 | 5/1995 | Abadeer et al. .................... | 365/100 |
| 5,502,674 | 3/1996 | Griffus et al. ...................... | 365/200 |
| 5,604,693 | 2/1997 | Merritt et al. ...................... | 365/96 |
| 5,619,469 | 4/1997 | Joo . | |
| 5,631,862 | 5/1997 | Cutter et al. ....................... | 365/96 |
| 5,657,293 | 8/1997 | Merritt et al. ..................... | 365/233.5 |
| 5,663,679 | 9/1997 | Manning ............................ | 327/567 |
| 5,680,360 | 10/1997 | Pilling et al. ..................... | 365/225.7 |
| 5,689,455 | 11/1997 | Mullarkey et al. ................. | 365/96 |

(List continued on next page.)

Primary Examiner—David Nelms
Assistant Examiner—Hoai V. Ho
(74) Attorney, Agent, or Firm—Jacobson, Price, Holman & Stern, PLLC

(57) ABSTRACT

The anti-fuse circuit includes three sub-blocks: a multiplexer having inputs of control signals and addresses and yielding the activation of a programming signal and program addresses; a programming voltage generator consisting of an oscillator and a charge pump; and an anti-fuse unit circuits for the program/read of anti-fuse states. For an anti-fuse program at the special test mode, a program address generation circuit having inputs of control signals and addresses activates the programming voltage generator and makes a special or program address for selection of anti-fuse. In the normal mode, the program address generation circuit and an internal power generator remain at an inactive state. In anti-fuse unit circuit, the program address and the programming voltage signal from the programming voltage generator serve to switch the terminal of the anti-fuse up to a programming voltage level when the anti-fuse is selected for programming of anti-fuse elements.

21 Claims, 9 Drawing Sheets

U.S. PATENT DOCUMENTS

| | | | |
|---|---|---|---|
| 5,724,282 | 3/1998 | Loughmiller et al. | 365/96 |
| 5,734,617 | 3/1998 | Zheng . | |
| 5,742,555 | 4/1998 | Marr et al. | 365/225.7 |
| 5,781,483 | 7/1998 | Shore | 365/200 |
| 5,790,448 | 8/1998 | Merritt et al. | 365/96 |
| 5,793,224 | 8/1998 | Sher . | |
| 5,793,692 | 8/1998 | Merritt et al. | 365/225.7 |
| 5,812,468 | 9/1998 | Shirley | 365/200 |
| 5,812,477 | 9/1998 | Casper et al. | 366/225.7 |
| 5,818,749 | 10/1998 | Harshfield | 365/105 |
| 5,818,778 | 10/1998 | Lui et al. | 365/225.7 |
| 5,825,697 | 10/1998 | Gilliam et al. | 365/200 |
| 5,831,923 | 11/1998 | Casper | 365/224.7 |
| 5,834,970 | 11/1998 | Manning | 327/567 |
| 5,838,620 | 11/1998 | Zagar et al. | 365/200 |
| 5,838,624 | 11/1998 | Pilling et al. | 365/225.7 |
| 5,838,625 * | 11/1998 | Cutter et al. | 365/225.7 |
| 5,841,712 | 11/1998 | Wendell et al. | 365/200 |
| 5,841,723 | 11/1998 | Ma | 365/225.7 |
| 5,848,010 | 12/1998 | Sher | 365/201 |
| 5,856,950 | 1/1999 | Cutter et al. | 365/225.7 |
| 5,875,144 | 2/1999 | Zheng | 365/225.7 |
| 5,886,392 | 3/1999 | Shuegraf | 257/530 |
| 5,886,940 | 3/1999 | Morzano et al. | 365/230.03 |
| 5,898,186 | 4/1999 | Farnworth et al. | 257/48 |
| 5,907,517 | 5/1999 | Komarek et al. | 365/210 |
| 5,912,579 | 6/1999 | Zagar et al. | 327/526 |
| 5,917,763 | 6/1999 | Mullarky | 365/200 |
| 5,920,516 | 7/1999 | Gilliam et al. | 365/200 |
| 6,097,645 * | 8/2000 | Penney et al. | 365/200 |

\* cited by examiner

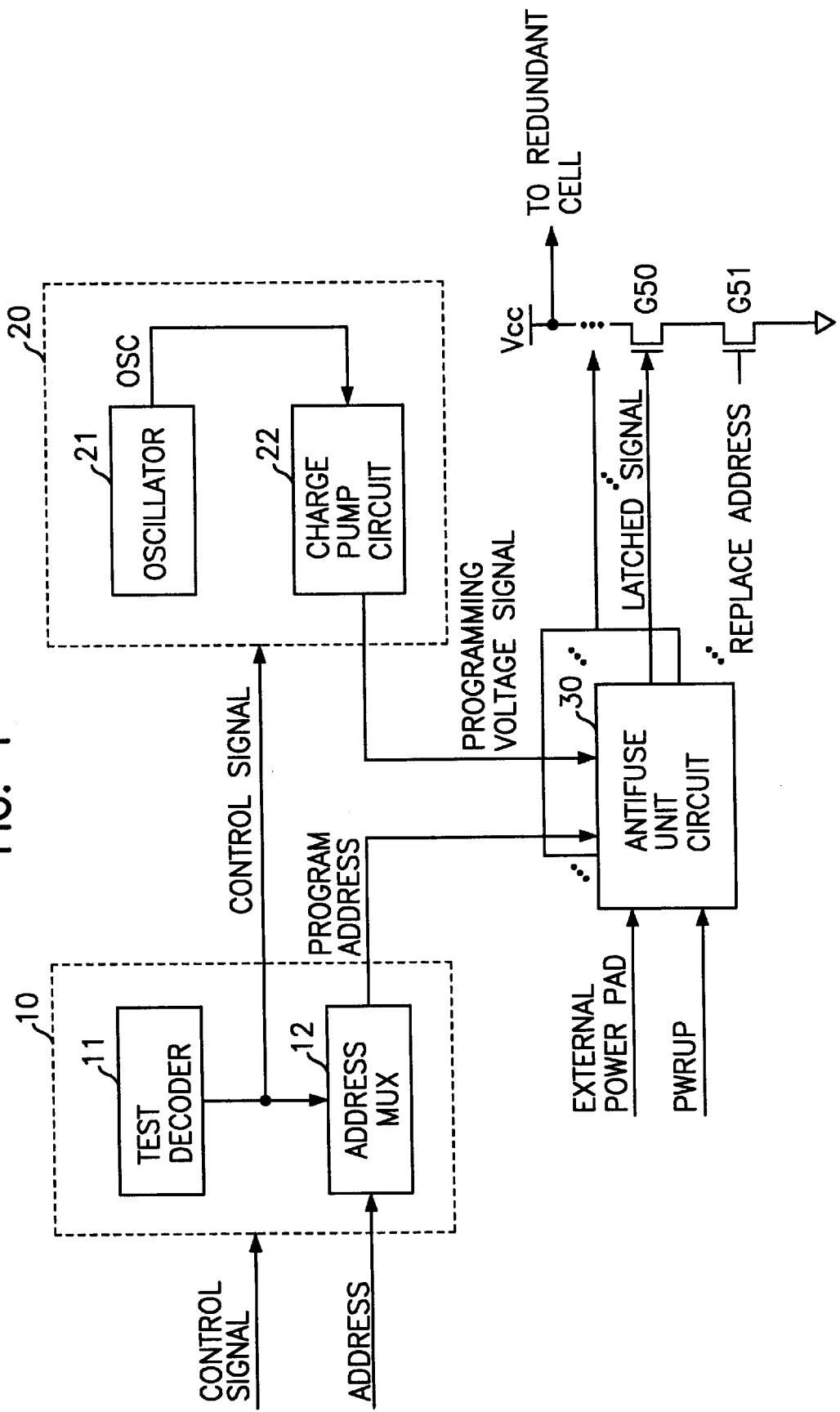

ANTIFUSE CIRCUITRY FOR POST-PACKAGE DRAM REPAIR

The application claim benefit the provisional application 60/115,377 Jan. 11, 1999.

FIELD OF THE INVENTION

This invention relates to an electrically programmable integrated circuit and an associated device structure for implementing a nonvolatile memory; and, more particularly, to anti-fuse circuitry, which is capable of effectively providing a post-package repair with electrically programmable anti-fuses.

DESCRIPTION OF THE PRIOR ART

A laser trimmed poly-silicon fuse structure is widely used in a programmable repair of a dynamic random access memory (DRAM) chip which is typically performed at a wafer level, typically, before a burn-in test. In a laser trimmed repair method employing the laser trimmed poly-silicon fuse structure, defective memory cells are identified by a wafer probe testing process. The poly-silicon fuse structure is then programmed by using a laser trimming technique to activate an address decoding of redundant memory cells in order to repair the DRAM chip. While the laser trimmed fuse structure is compact and reliable, the laser trimmed repair method can only be efficiently performed at the wafer level. As a result, it may preclude the ability for repairing any defective memory cell, which is found after a packaging process and generally occurs during the burn-in test.

On the other hand, with an electrically programmable nonvolatile memory, many types of post package failures can be repaired resulting in a significant yield improvement of a high density DRAM.

An anti-fuse structure and associated circuitry suitable for use in integrated circuits are generally incorporated in a nonvolatile memory device. It is expected to be particularly useful for an electrically programmable repair technique of a DRAM using a redundant memory capacity. Specifically, through the addition of special test modes, it is possible to implement this functionality without any alteration of the existing product pin-out specifications.

On the other hand, in addition to its uses in DRAM manufacture, it may be envisioned that this functionality can also be effectively utilized in the field or by end users as a part of a test-and-repair procedure. Similarly, it is also possible to program other useful and unique nonvolatile data into the DRAM component such as encryption keys, serial numbers, manufacture dates and other quality tracking identification.

A basic anti-fuse element is generally a resistive fuse component which has a very high resistance (>100 Mohm) in its initial unprogrammed state and, after an appropriate programming operation, will have a significantly lower resistance (<10 Kohm). The anti-fuse element is typically composed of a very thin dielectric material such as silicon dioxide, silicon nitride, tantalum oxide or a sandwich combination of dielectrics such as ONO (silicon dioxide-silicon nitride-silicon dioxide) between two conductors. The anti-fuse is programmed by applying an appropriate programming voltage under sufficient current flow through terminals of the anti-fuse for a sufficient time to cause the resistance of the anti-fuse to permanently change from high to low.

The programming voltage is typically larger in magnitude than a normal operating voltage so that the programming voltage may cause damage and reduce the reliability of associated neighboring devices and peripheral circuitry, which are improperly isolated. In particular, the peripheral circuitry for providing the programming voltage and for reading an anti-fuse resistance will typically be directly attached to the anti-fuse element to thereby be subjected to potential damage.

The integrity of the anti-fuse in both of its initial unprogrammed and programmed states may be adversely affected by several factors. For example, an extended exposure at elevated temperatures or application of a continuous current or voltage bias across the anti-fuse element may alter the properties of the thin dielectric resulting in an increase or decrease in the anti-fuse resistivity and potentially causing an error or degraded performance thereof. When programming a single anti-fuse element, an internally or externally generated programming voltage (or current) signal, Vhv (or Ihv), is applied across terminals of the anti-fuse element for a sufficient time. However, when a plurality of anti-fuse elements is used such as in a multiplexed array, non-selected anti-fuse elements may be subjected to unintentional programming signals resulting in an accidental change of conductivity of the thin dielectrics.

The reliable programming and reading of the anti-fuses requires several important key components.

First, an appropriate programming voltage or current signal must be generated internally or supplied externally. Specifically, an internal high voltage for the anti-fuse programming requires a careful isolation and biasing of device structures such as PN junctions and gate dielectrics, in order to insure that they are not subjected to large voltage differences. The large voltage differences may cause a premature breakdown, a reduced reliability, an excessive leakage current, a field oxide inversion, latch-up or failure. Similarly, if the programming voltage is provided externally, there must be a method of supplying this voltage without interference from normal electro-static discharge(ESD) circuitry typically used on the integrated circuit output pads and/or pins.

Second, there should be a method to address-select and program individual anti-fuses which also requires further manipulation of a programming signal.

Third, an appropriate method for sensing or reading the state of the anti-fuse is required. The anti-fuse state is typically read upon device activation or immediately after powered up. In order to reduce a risk of an anti-fuse failure due to a continuous read operation and to improve a read access speed to the anti-fuse information, a volatile memory should be provided with appropriate circuitry which can effectively provide a proper sense/latch operation of the anti-fuse state in a wide range of operating conditions.

However, up to date, there is no circuitry for effectively implementing the above three requirements.

SUMMARY OF THE INVENTION

It is, therefore, an object of the present invention to provide an anti-fuse circuit, for use in an anti-fuse based random access memory (RAM), which is capable of proving improved yield, reliability and functionality of a RAM, specifically a synchronous DRAM (SDRAM).

A schematic block of this invention is simply illustrated as shown in FIG. 1. The present invention includes three sub-blocks: a multiplexer having inputs of control signals and addresses and yielding the activation of a programming signal and program addresses (sub-block 10); a programming voltage generator consisting of an oscillator and a charge pump (sub-block 20); and an anti-fuse unit circuit for the program/read of anti-fuse states (sub-block 30).

First, for an anti-fuse program at a special test mode, the sub-block 10 having inputs of control signals and addresses activates the programming voltage generator and makes a special or program address for the selection of an anti-fuse unit circuit. In a normal mode, the sub-block 10 and the sub-block 20 remain at an inactive state. In the sub-block 30, the program address and the programming voltage signal from the programming voltage generator serve to switch the terminal of the anti-fuse up to a programming voltage level when the anti-fuse is selected for programming of anti-fuse elements.

In accordance with one embodiment of the present invention, in the sub-block, an internal voltage generator comprises several specific-devised elements for enduring a negative voltage or a high voltage. As shown in FIG. 2, two types of voltage generators are illustrated with diodes and capacitors used for a special purpose. The capacitors (C2~C6) coupled to a high voltage generator and each diode are made of poly and metal layers, which are formed as layer-by-layer stacked arrays (named as "finger-shaped stacked-array capacitor"). They have a bigger capacitance (6~7 times) than that of a planar metal capacitor at the same area and a higher voltage endurance (<20 V) than that of an ONO or gate capacitor. The diodes shown in FIG. 2 are made of a triple well, which has good characteristics such as preventing a leakage current and isolating other devices from negative or high voltages of the programming mode.

In another embodiment of the present invention, the multiplexer used in the sub-block 10 prevents undesirable voltages from being applied to the anti-fuse in the sub-block 30 while other anti-fuse is programmed. Then, anti-fuse unit circuits in the sub-block 30 have a variety of schemes such as uni-polar and bipolar according to programming voltages or types of transistors used for a programming power transfer. For a reading mode, some circuits are devised to improve the reliability of anti-fuses in certain types of systems by substantially eliminating the undesirable continuous supply of voltage signals to the anti-fuse terminals and improving the sensing speed of the programmed anti-fuses for a failed-bit repair. The evaluation of the state of the anti-fuse, such as "programmed" or "unprogrammed", is operated with special circuits during a power-up period so that an extra time for the evaluation of the anti-fuses does not need. The signal describing the state of the anti-fuse is then stored in a latch through a buffer, which effectively improves the immunity of a variation of the impedance of the programmed anti-fuse or unexpected noises. If the anti-fuse is unprogrammed, then its latch signal is in a high voltage level and the NMOS transistor replacing the poly fuses or metal fuses for a laser repair scheme is normally in an on-state. In this way, it is not necessary to accomplish a direct read operation of anti-fuse state only except when the power is on, and a read current does not flow in the anti-fuses in response to the standard chip operation mode. Thus, continuous voltages across the two terminals of the anti-fuse are avoided and an unprogrammed anti-fuse is not easily converted back to its high impedance state (i.e. "unprogrammed"). The circuit further includes a memory system capable of being coupled and de-coupled to the anti-fuse by a latch circuit through an evaluation buffer.

BRIEF DESCRIPTION OF THE DRAWINGS

The above and other objects and features of the present invention will become apparent from the following description of preferred embodiments given in conjunction with the accompanying drawings, in which:

FIG. 1 illustrates a schematic diagram of a programmable anti-fuse circuit used for a DRAM redundancy scheme in accordance with one embodiment of the present invention;

DETAILED DESCRIPTION OF THE PREFERRED EMBODIMENTS

Figure 2A:
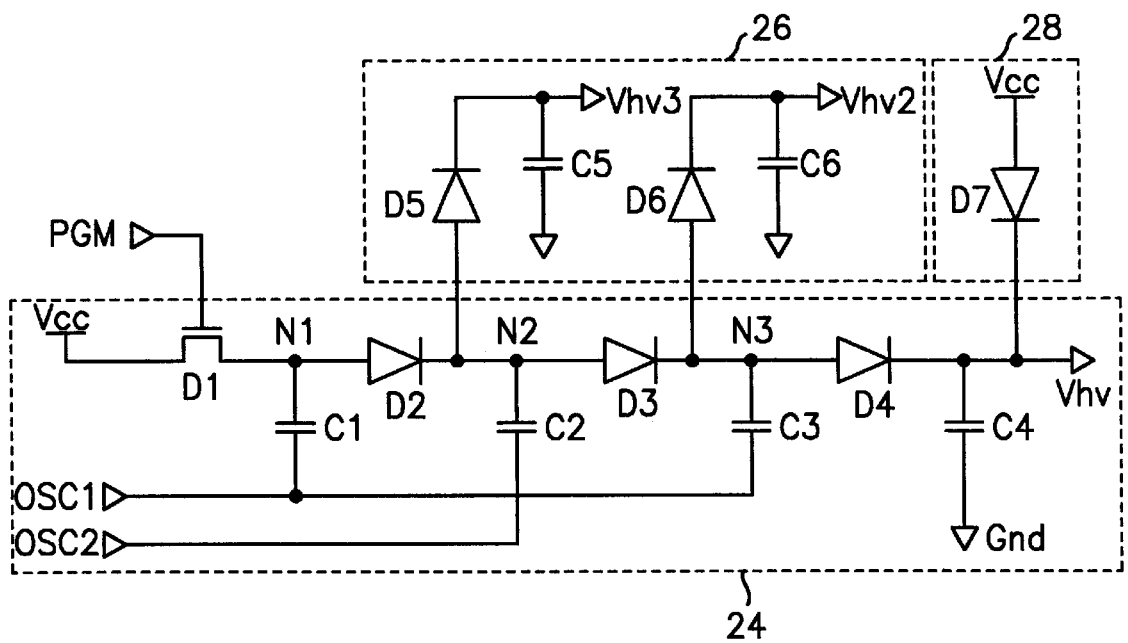
FIGS. 2A to 2F illustrate circuit diagrams for sources of programming potentials and their device elements such as diodes devised with a triple-well structure and a finger-shaped stacked-array capacitors devised with poly and metal layers.

This invention includes any function or device, which is required for nonvolatile memory capability, such as but not limited to: 1) an electrical redundancy programming of memory devices; 2) serial number or identification programming of integrated circuits; 3) security and encryption key programming of the integrated circuits; 4) programming of function options of the integrated circuits; and 5) replacement for a read only memory (ROM) or an erasable programmable read only memory (EPROM).

The functions in accordance with the present invention can be simply described as: (1) special or program address generation for anti-fuses selected for programming by a selection circuit and other address circuitry such as the special address multiplexer in the special test mode; (2) internal voltage generation for programming: and (3) programming during special test mode and reading during power-up. During programming, a programming voltage is selectively and sequentially applied across each anti-fuse designated for programming. Non-designated anti-fuses are protected from programming voltages to prevent unintentional programming or unprogramming. Typically this scheme can be mixed for an internal and external power for programming. That is, the internal power generator can be coupled to an external power pin on an integrated circuit or a DRAM chip being programmed, if needed. If the external power pin is used, the ESD protection circuit will be included for the external power pad.

In accordance with the present invention, the state of the anti-fuse is preferably stored in a latch since the pre-latched buffer serves to effectively sense the anti-fuse state during the power-up period although the impedance of the programmed anti-fuse is to be widely varied. Due to the relatively reliable reading operation, the period of the programming time, the magnitude of the programming voltage, and the amount of programming current can be also decreased.

Referring to FIG. 1, there is illustrated a programmable anti-fuse circuit in accordance with a preferred embodiment of the present invention. The programmable anti-fuse circuit includes a program address generation circuit 10, an internal power generator 20 and a plurality of anti-fuse unit circuits 30.

Each of the anti-fuse unit circuit 30 is coupled to a switching transistor G50 which is connected to a dummy cell G51 and serves to activate the dummy cell G51. The program address generation circuit 10 has a test decoder 11 and an address decoder 12 which are activated by receiving a control signal representing a special test mode to generate a program address for the anti-fuse unit circuits 30. The special test mode signal can be generated by, for example, a user activation. When the special test mode is activated by an external control signal, the program address generation circuit 10 selects one of the anti-fuse unit circuits 30 by using the program address for an anti-fuse programming and provides an internal control signal to the internal power generator 20. A programming voltage signal generated from the internal power generator 20 which is also responsive to the internal control signal, is then applied to the selected anti-fuse unit circuit 30. During the programming procedure, the anti-fuse unit circuits 30 can be sequentially selected by the program address circuit 10.

Figure 3A:
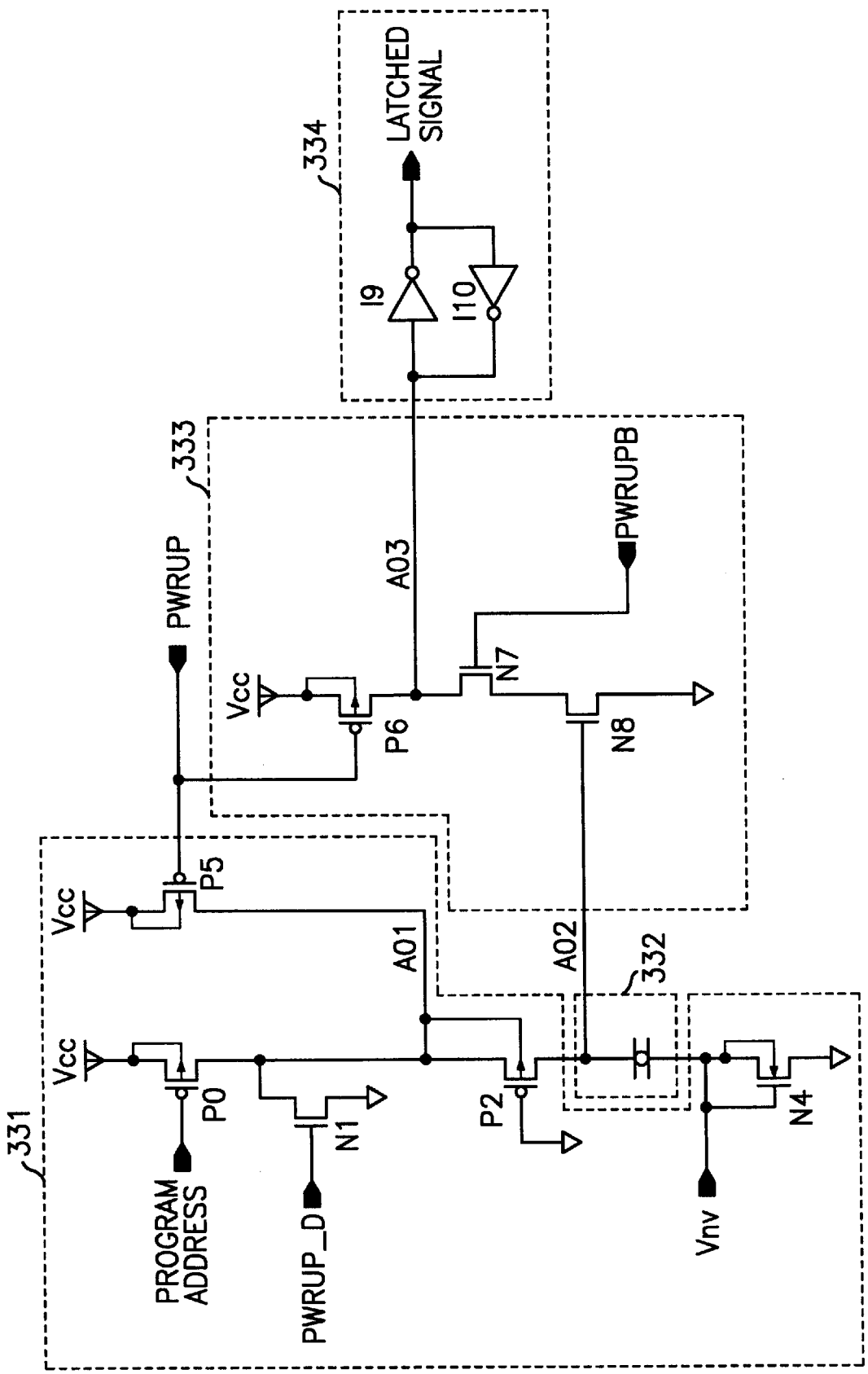
FIGS. 3A and 3B illustrate a circuit diagram of an anti-fuse unit circuit for improving the readability and reliability of anti-fuses based on a programming voltage of −4 V and 4 V between two terminals of anti-fuse; and a timing chart depicting the operation of the anti-fuse unit circuit in accordance with another embodiment of the present invention.
Figure 4:
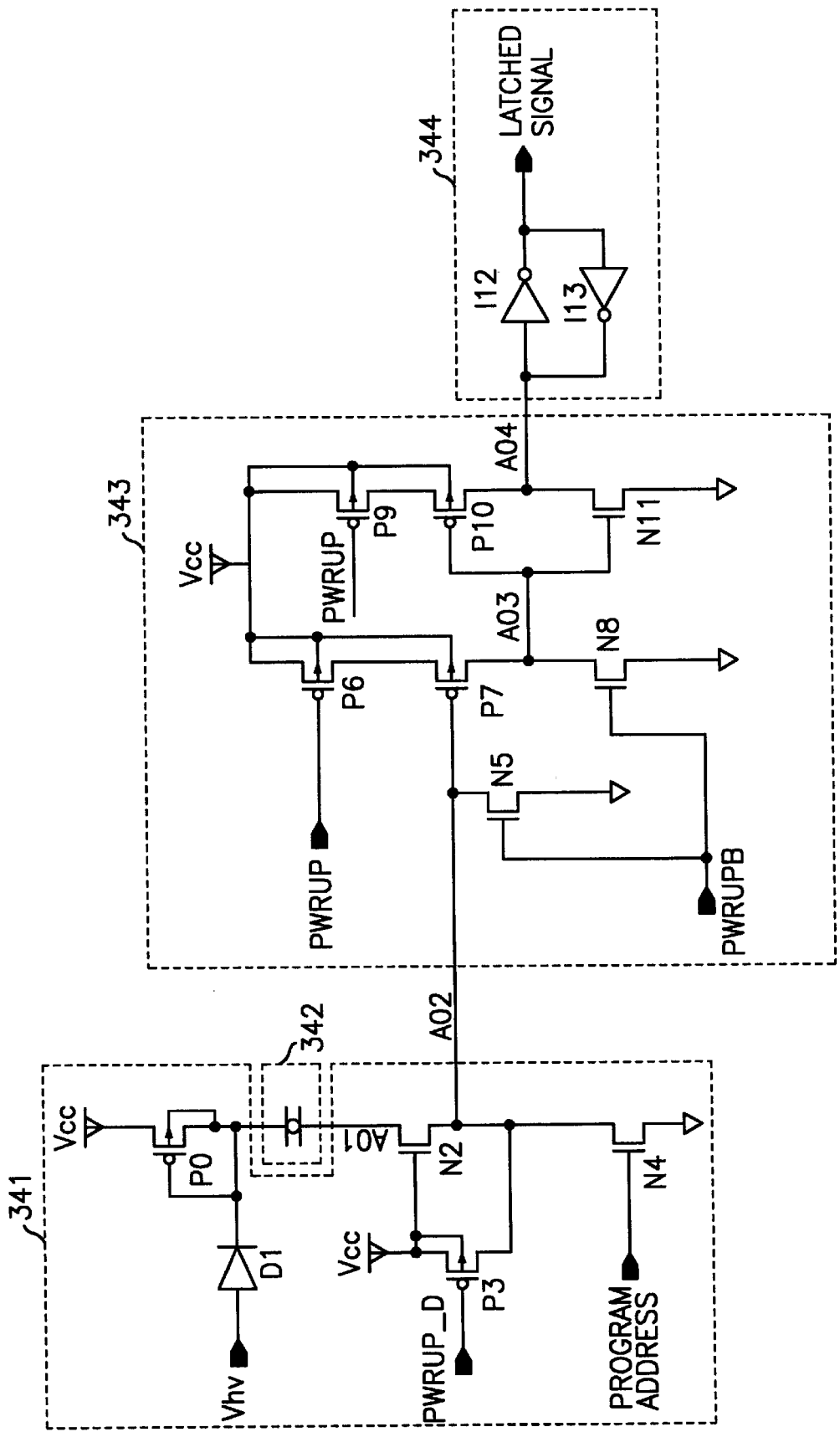
FIG. 4 illustrates a circuit diagram of an anti-fuse unit circuit for improving the readability and reliability of anti-fuses based on a programming voltage of 8 V and 0 V between two terminals of anti-fuse in accordance with another embodiment of the present invention.
Figure 5A:
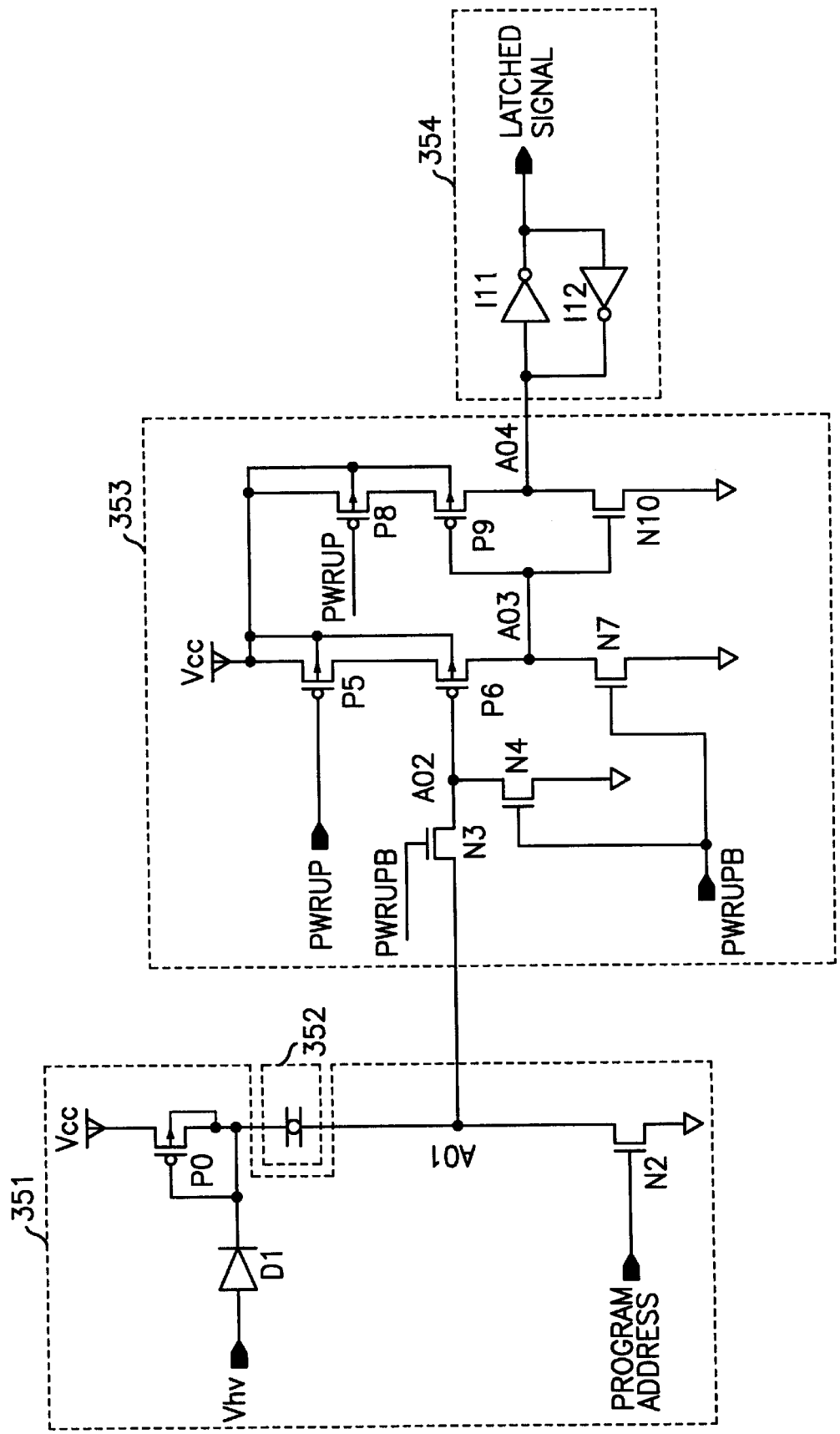
FIGS. 5A and 5B illustrate a circuit diagram of an anti-fuse unit circuit for improving the readability and reliability of anti-fuses based on modified transistors and a programming voltage of 8 V and 0 V between two terminals of anti-fuse; and a diagram showing the structure of a hybrid transistor employed in the anti-fuse unit circuit in accordance with further another embodiment of the present invention.

The internal power generator 20 includes two parts: an oscillator 21 and a charge pump circuit 22. In a uni-polar voltage system in accordance with one embodiment of the present invention, as shown in FIGS. 4 and 5A, a high voltage such as 8 V, Vhv, generated from the internal power generator 20 is coupled to the selected anti-fuse unit circuit 30 during the programming procedure. However, in a bipolar voltage system in accordance with another embodiment of the present invention as shown in FIG. 3A, a negative voltage, Vnv, can be coupled to the selected anti-fuse unit circuit 30 during the programming procedure. When the programming procedure is complete and the external control signal representing the special test mode is changed into a disable state, all of the anti-fuse unit circuits 30 are deselected and the internal power generator 20 is also changed to a disable state.

When a power-up procedure is initiated, a reading or evaluation for anti-fuses states is carried out in the anti-fuse unit circuits 30. Each anti-fuse unit circuit 30 receives a power-up signal PWRUP and a state of an anti-fuse contained in each anti-fuse unit circuit 30 is transmitted as a latched signal to the switching transistor G50. That is, each anti-fuse unit circuit 30 generates the latched signal as a low voltage level signal representing an anti-fuse programmed state or a high voltage level signal denoting an anti-fuse unprogrammed state. In addition, an external voltage source Vcc can be changed from 4 V for the programming procedure to 3.3 V for a reading operation.

Figure 2B:
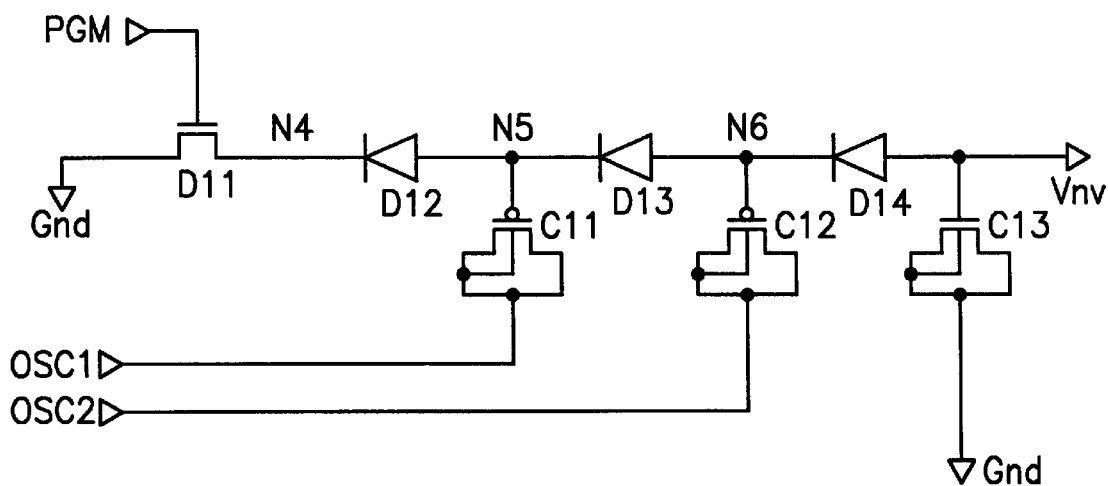
Figure 2C:
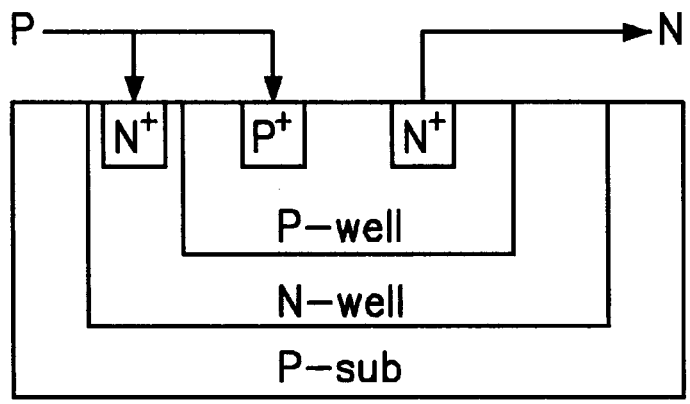

Referring to FIGS. 2A and 2B, two embodiments of the charge pump circuit contained in the internal power generator 20 shown in FIG. 1 are illustrated. The control signal is activated and applied to the oscillator 21 and the charge pump circuit 22 shown in FIG. 1. During the programming procedure at the special test mode, the control signal PGM generated from the program address generation circuit 10 shown in FIG. 1 become to a high voltage state for both negative and positive voltages. FIG. 2A illustrates a charge pump circuit, which contains three parts: a high voltage generator 24, a high voltage driver 26 and a pre-charge voltage generator 28 for applying the external source voltage Vcc. An NMOS transistor D1 is operated as a diode when a PGM signal represents a high voltage state and applies a voltage signal Vcc-Vtn, wherein Vtn is a threshold voltage of D1, into node N1. Diodes D2~C7 are newly designed with a PN diode connected with a P-well to an N-well junction as shown in FIG. 2C.

As shown, the PN diode structure is substantially formed with a triple well structure where a P-well is inserted into a N-well formed on a P-substrate. In such a diode, the P-substrate is connected to a ground Gnd and the N-well serves to isolate the P-well from the P-substrate in order to prevent a current flow from the P-well to the P-substrate. Another merit of the PN diode structures is that a breakdown voltage between the N-well and the P-well is higher than a programming voltage. Capacitors C1~C3 are used for a charge pumping effect and capacitors C4~C6 are used as loading capacitors reducing the oscillation amplitude of output voltage signal Vhv, which are determined to have relatively a small capacitance than that of the charge pumping capacitors C1~C3.

Figure 2D:
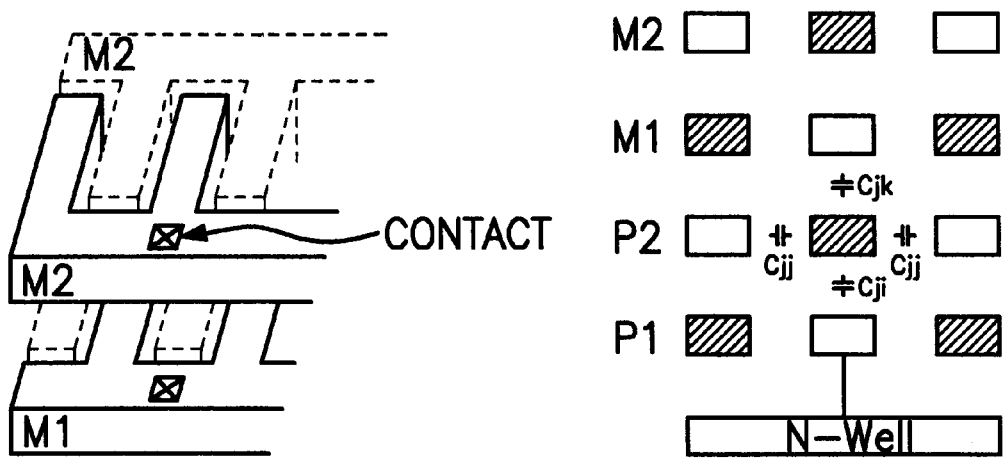
Figure 2E:
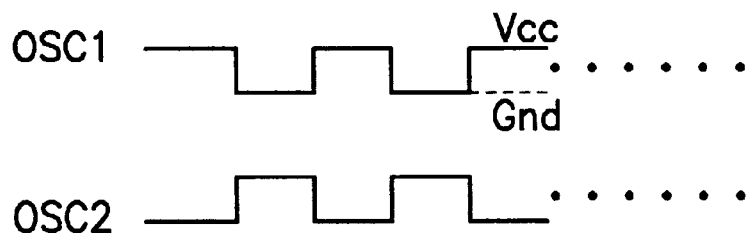

As shown in FIG. 2E, when the PGM signal becomes a high voltage level for N1 node pre-charge operation and in-phase and out-phase clocks OSC1 and OSC2 generated from the oscillator 21 are continuously provided, a high voltage signal generated from the high voltage generator 24 is supplied to the selected anti-fuse unit circuit 30. Initially, the voltage of the node N1 becomes a voltage Vcc-Vtn when the PGM signal is enabled as a high voltage level. When the clock OSC1 changes from a ground voltage level to an external voltage level Vcc, charges supplied by the OSC1 are fed to the node N1 whose voltage level becomes 2Vcc-Vtn. The voltage level is again transferred to a node N2 whose voltage level becomes 2Vcc-2Vtn.

Thereafter, when the clock OSC2 changes from the ground voltage level to the external voltage level Vcc, a voltage level of the node N2 is charged to 3Vcc-2Vtn and a voltage level of the node N3 changes to 3Vcc-3Vtn. Next if the clock OSC1 changes from the ground voltage level to the external voltage level Vcc, the voltage level of the node N3 is charged to 4Vcc–3Vtn. Finally, the voltage levels of the nodes N1, N2, N3 and Vhv are changed to 2Vcc-Vtn, 3Vcc-2Vtn, 4Vcc-3Vtn and 4Vcc-4Vtn, respectively. A high voltage output signal Vhv can be generated by supplying the above clocks. The high voltage output signal Vhv is then coupled to the anti-fuse unit circuit 30 as a programming voltage signal.

The high voltage driver 26 includes two diodes D5~D6 which serve to provide two different output voltage levels such as Vhv2 and Vhv3 of 4Vcc-4Vtn and 3Vcc-3Vtn, respectively. When a reading mode, the pre-charging voltage generator 28 changes a voltage level of the output node Vhv into a pre-charging voltage level Vcc–Vtn. The pre-charging voltage level can be used for the evaluation of an anti-fuse state.

As shown in FIG. 2D, the capacitors C2~C6 used in a high voltage are formed with poly and metal layers M1 to M2 and P1 to P2. The high voltage capacitors C2~C6 can provide a larger capacitance by using added mutual capacitances Cjj, Cji and Cjk due to a finger-stacked type which is called a finger-shaped stacked-array capacitor.

Figure 2F:
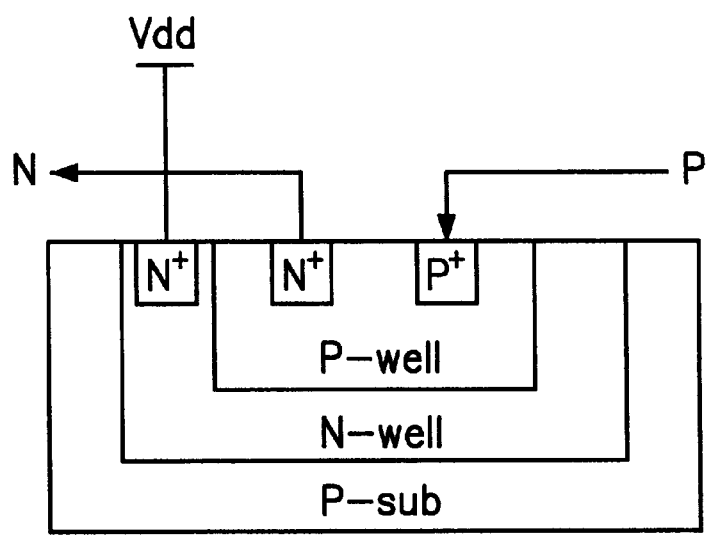

Referring back to FIG. 2B, a charge pump circuit 22 in accordance with another embodiment of the present invention is illustrated. The charge pump circuit 22 serves as a negative voltage generator for used in a bipolar voltage scheme of the anti-fuse programming procedure. Diodes D12–D14 shown in FIG. 2B are similar to those of FIG. 2A, wherein a structure of each diode is also described in FIG. 2F. Capacitors C11 and C12 are formed by using PMOS transistors and used in a charge pumping operation, whereas a capacitor C13 is a loading capacitor.

When the clock OSC1 changes from the ground voltage level to the external voltage level Vcc, a voltage level of a node N5 is charged to the external voltage level Vcc. The external voltage level Vcc is then transferred into a node N4 until the voltage level of the node N5 reaches a threshold voltage level Vtn of the diode D12. The node N4 is tied to the ground voltage through a transistor D11. When the OSC1 and the OSC2 clocks concurrently change to the ground voltage level and the external voltage level Vcc, respectively, the node N5 and a node N6 are changed to voltage levels Vtn–Vcc and Vcc, respectively. The voltage level of the node N6 remains at a voltage level 2Vtn-Vcc after its charges are discharged through the diodes D11, D12 and D13. As a result, an output voltage level of an output node Vnv becomes 3Vtn-Vcc. When the OSC1 and OSC3 clocks change to the external voltage level Vcc and the ground voltage level, respectively, the nodes N5 and N6 change to Vtn and 2Vtn-2Vcc, respectively. Therefore, a voltage level of the output node Vnv becomes 3Vtn-2Vcc. Finally, the nodes N4, N5, N6 and the output node Vnv converge to the ground voltage level, Vtn–Vcc, 2Vtn-2Vcc, 3Vtn-2Vcc, respectively, after repeating clock operations. The output voltage level Vnv is then coupled to the anti-fuse unit circuit 30 as the programming voltage signal.

Referring to FIG. 3A, an anti-fuse unit circuit 30 employing a bipolar voltage programming scheme in accordance with one embodiment of the present invention is illustrated. The anti-fuse unit circuit 30 includes an anti-fuse selection circuit 331, an anti-fuse element 332, an anti-fuse state evaluation circuit 333, and a latch circuit 334.

The external voltage level Vcc, e.g., +4 V is applied via two PMOS transistors P0 and P2 and an NMOS transistor N1 to one terminal of the anti-fuse element 332 and the programming voltage signal Vnv, e.g., –4 V is applied to the other terminal thereof during the programming procedure. The program address is applied to the gate of the PMOS P0 which is turned on to thereby transmit the external voltage level to the PMOS transistor P2. The PMOS transistor P2 is serially connected to the PMOS transistor P0 and is used as a pass-transistor, wherein a power-up signal includes a first power-up signal PWRUP, a second power-up signal PWRUPB and a third .power-up signal PWRUP_D. The NMOS transistor N1 is connected to a node A01 and maintains a turn-off state in response to the third power-up signal PWRUP_D during the anti-fuse programming procedure, wherein the third power-up signal PWRUP_D initializes the node A01 to ground voltage level within about 5 nsec. The PMOS transistor P2 serves to protect junctions of the PMOS transistor P0 and a PMOS transistor P5 from the programming voltage signal Vnv, e.g., –4 V. The programming voltage signal Vnv is connected between the terminal of the anti-fuse element 332 and an NMOS transistor N4 which serves as a diode having a common gate, a substrate and a drain.

Figure 3B:
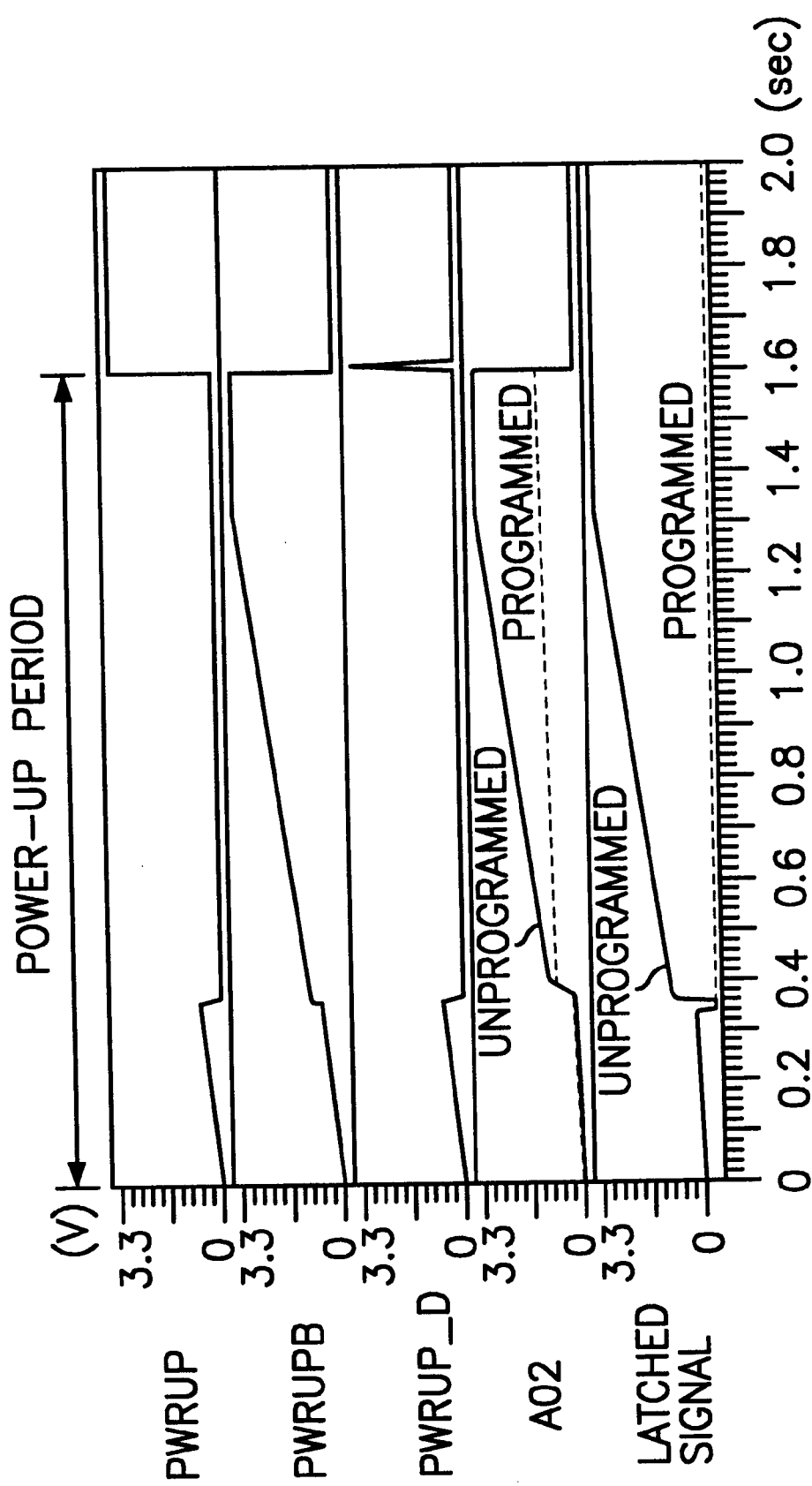

In the read mode, as shown in FIG. 3B, the state evaluation circuit 333 is operated during a power-up period shown in FIG. 3B. When the anti-fuse element 332 is programmed, the terminal A02 of the programmed anti-fuse element 332 is brought to a low voltage level. That is, the voltage level of the terminal A02 is typically a threshold voltage level Vtn of the NMOS transistor N4 since the charge pump circuit 20 in FIG. 1 is not operated and the programming voltage signal Vnv is floated. The first power-up signal PWRUP maintains a low voltage level state until the power is fully stabilized and the second power-up signal PWRUPB is increasing proportionally to the external voltage level Vcc. The external voltage signal Vcc is transmitted to a node A02 through the PMOS transistor P2 and the PMOS transistor P5 during the power-up period. If the anti-fuse element 332 is programmed, the voltage of the node A02 decreases gradually and changes to a low voltage level state (near 1 V). However, if the anti-fuse element 332 is unprogrammed, the voltage of the node A02 maintains a high voltage level state (near Vcc). In addition, When the external voltage signal Vcc is transmitted to the node A03 through the PMOS transistor P6 and the second power-up signal PWRUPB maintains a high voltage level state, an NMOS transistor N7 becomes a turn-on state. On or off state of an NMOS transistor N8 is determined depending on the voltage of the node A02 so that the voltage level of the node A03 is then determined based on the state of the NMOS transistor N8. When the anti-fuse element 332 is programmed, the node A02 maintains a low voltage level state and the node A03 remains a high voltage level state. If unprogrammed, the node A02 is a high voltage level state and the node A03 becomes a low voltage level state.

The latch circuit 334 maintains information read from the anti-fuse element 332 as a latched signal through the state evaluation circuit 333. Such an initial latch of the anti-fuse state improves a sensing speed of a repair cell reading mode and a programming accuracy over wide range of programming bias and current. Further, since the number of an anti-fuse element accesses can be reduced, the reliability of the anti-fuse element also can be improved.

Referring to FIG. 4, there is shown an anti-fuse unit circuit 30 employing a uni-polar high voltage scheme which includes an anti-fuse selection circuit 341, an anti-fuse element 342, an anti-fuse state evaluation circuit 343, and a latch circuit 344. The external voltage signal Vcc for the programming procedure is coupled to the anti-fuse element 342 through a PMOS transistor P0. A programming voltage signal Vhv is coupled through D1 to one terminal of the anti-fuse element 342 and the ground voltage is fed to the other terminal of the anti-fuse element 342 via two NMOS transistors N2 and N4 during the programming procedure. The diode D1 prevents a current flow from the external voltage source Vcc to a power lead for the programming voltage signal Vhv floated during the read operation.

A power-up signal PWRUP_D initializes a node A01 within about 5 nsec after the power stabilization operation so that the node A01 is pre-charged near Vcc through a PMOS transistor P3 and an NMOS transistor N2. The high voltage signal for a program address is applied to an NMOS transistor N4 to discharge the pre-charged voltage signal Vcc and connect the ground voltage to the anti-fuse element 342. Therefore, the voltage level of the node A02 is changed to the ground voltage level, turning on the NMOS transistor N2 and the NMOS transistor N4, simultaneously. Consequently, the voltage difference between the two terminals of the selected anti-fuse element 342 becomes a relatively high voltage, Vhv, during the programming procedure. In case of the unselected anti-fuse unit circuit 30, the low voltage signal of the program address is unchanged and the voltage difference between the two terminals of the unselected anti-fuse element 342 maintains near Vhv-Vcc. The NMOS transistor N2 protects junctions and gates of a PMOS transistor P3, the NMOS transistor N4, an NMOS transistor N5, and an NMOS transistor N7 from the programming voltage signal Vhv to thereby prevent junction breakdowns or gate breakdowns.

In the read mode, the anti-fuse state evaluation circuit 343 operates during the power-up period shown in FIG. 3B. The first power-up signal PWRUP maintains a low voltage state until the power is fully stabilized and the second power-up signal PWRUPB is increased proportionally to the external voltage signal Vcc. The terminal of the anti-fuse element 342 is brought to a high voltage, typically Vcc–Vtp through the PMOS transistor P0 since the charge pump circuit 20 in FIG. 1 is not operated so that the lead for the programming voltage signal Vhv is floated. If the anti-fuse element 342 is programmed, the voltage of the node A02 maintains a high voltage state (near Vcc-Vtn). In case that the anti-fuse element 342 is unprogrammed, the voltage at the node A02 remains at the ground voltage since the NMOS transistor N5 remains turned-on by the high voltage level of the second power-up signal PWRUPB. Therefore, the NMOS transistor N5 is small in size so that the voltage of the node A02 is not seriously reduced by a turned-on state of the NMOS transistor N5.

When the first power-up signal PWRUP maintains a low voltage state, the external voltage Vcc is transmitted to the PMOS transistors P7 and P6. An NMOS transistor N8 is then turned on by the high first power-up signal PWRUP so that the PMOS transistor P7 turns on according to the level of the node A02. When programmed, the node A02 maintains a high voltage state so that the PMOS transistor P7 is at weakly turned-on state. Consequently, the node A03 serially connected to the NMOS transistor N8 is a low voltage state. If unprogrammed, the node A02 is a low voltage state and the PMOS P7 becomes a fully turned-on state. The node A03 by the turned-on states of the PMOS transistors P6 and P7 is transmitted to a high voltage state. The size of the NMOS transistor N8 is small enough for a smaller current flow through the NMOS transistor N8 than that through the PMOS transistor P7. The low or high voltage state of the node A04 is dependent on the voltage of the node A03 since the first power-up signal PWRUP maintains a low voltage state. The variation of the voltage difference between the programmed and the unprogrammed states is not large enough for controlling the PMOS transistor P7 so that a buffer is needed. The controlled buffer consisting of a pull-up PMOS transistor P9, a PMOS transistor P10 and a pull-down NMOS transistor N11 connected between the node A03 and the node A04 can be easily evaluated on the state of the anti-fuse element 342. The latch circuit 344 can easily latch the state of the anti-fuse element 342 by the amplified signal of the node A04.

The latch circuit 344 maintains information read from the anti-fuse element 342 as the latched signal.

Referring to FIG. 5A, there is demonstrated an anti-fuse unit circuit 30 employing a uni-polar high voltage scheme in accordance with another embodiment of the present invention, which has an anti-fuse selection circuit 351, an anti-fuse state evaluation circuit 353, and a latch circuit 354.

The anti-fuse selection circuit 351 includes same circuit elements of the anti-fuse selection circuit shown in FIG. 4 except the PMOS transistor P3 and the NMOS transistor N2 shown in FIG. 4. The anti-fuse state evaluation circuit 353 has same circuit elements of the anti-fuse state evaluation circuit 343 shown in FIG. 4 except an NMOS transistor connected between nodes A01 and A02 shown in FIG. 5A. In the programming procedure, the NMOS transistor serves to substantially isolate the anti-fuse selection circuit 351 from the anti-fuse evaluation circuit 353.

The external voltage Vcc is coupled to one terminal of the anti-fuse element 352 through a PMOS transistor P0. The programming voltage Vhv is coupled through a diode D1 to the one terminal of the anti-fuse element 352 and the ground voltage is coupled to the other terminal of the anti-fuse element 352 during the programming procedure. The diode D1 prevents a current flow from the external voltage source Vcc to a power lead for the programming voltage signal Vhv floated during a read operation. The high voltage signal of a program address is applied to the NMOS transistor N2 to discharge the pre-charged voltage by using the capacitance coupling of the anti-fuse element 352 and connect a source of the ground voltage on the anti-fuse element 352. Consequently, the voltage difference between the two terminals of the selected anti-fuse element 352 becomes a relatively high voltage Vhv, during the programming procedure.

In case that the anti-fuse unit circuit 30 is unselected, the low voltage signal of the program address is applied to the NMOS transistor N2. The voltage difference between the two terminals of the unselected anti-fuse element 352 is determined by the ratio of leakage currents through the anti-fuse element 352 and the NMOS transistors N2 and N3 junctions.

Figure 5B:
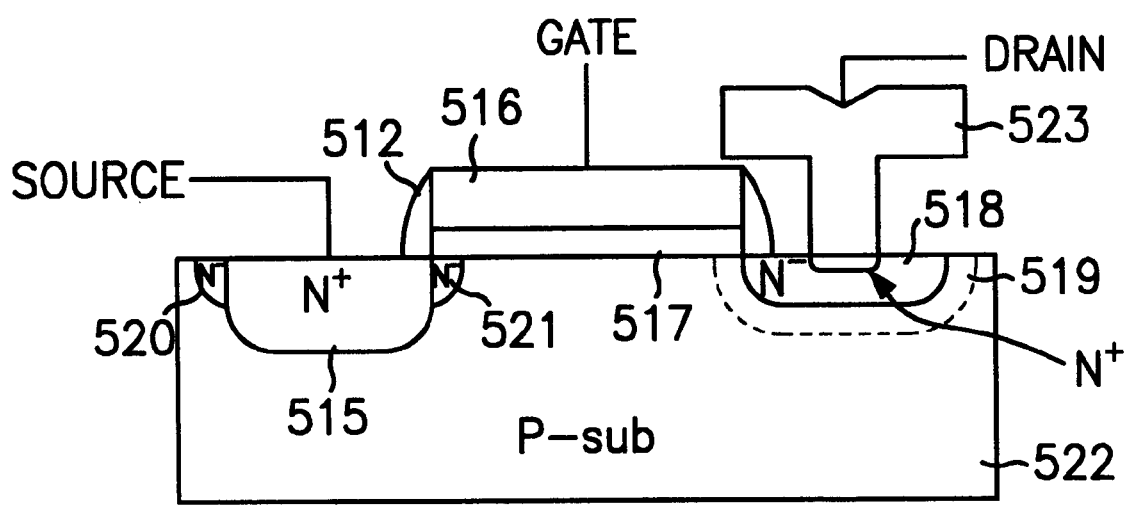

As shown in FIG. 5B, the NMOS transistors N2 and N3 are prepared by using a hybrid transistor. The source of the hybrid transistor contains a heavily doped N+ region 515 and two lightly doped N– regions 520 and 521 one of which is overlapped over the lower portion of the gate region of the hybrid transistor. The drain of the hybrid transistor is formed only with an N– region 518. A drain electrode DRAIN is connected through a buffered poly 523 to the N– region 518, wherein the upper portion of the buffered poly is extended over the upper portion of the gate. A smaller N+ region is formed on the lower portion of the buffered poly to form an ohmic contact between the N+ region and the lower portion of the buffered poly. The gate region includes a poly oxide layer 517, a poly layer 516 and spacers 512 formed on side portions thereof. Therefore, if a high voltage, e.g., 8 V is applied to the hybrid transistor, a depletion region 519 is formed on the lower portion of the drain region 518 so that an electric field is distributed over the depletion region 519. The depleted region 519 is overlapped on the lower portion of the gate region to thereby effectively protect the gate breakdown due to the high voltage.

Referring back to FIG. 5A, in the read mode, the state evaluation circuit 353 operates during the power-up period.

In case that the anti-fuse element 352 is programmed, a voltage of the node A02 maintains a high voltage state (near Vcc-Vtn). In case that the anti-fuse element 352 is unprogrammed, the voltage of the node A02 still remains at the ground voltage since the NMOS transistor N4 remains a turned-on state by the high voltage state of the first power-up signal PWRUP. The operation of the anti-fuse evaluation circuit 353 is similar to that of the anti-fuse circuit 343 shown in FIG. 4.

Consequently, the latch circuit 354 effectively maintains information read from the anti-fuse element 352 as the latched signal.

While the present invention has been described with respect to certain preferred embodiments only, other modifications and variations may be made without departing from the spirit and scope of the present invention as set forth in the following claims.

What is claimed is:

1. An integrated circuit having a number of replace address signal generators, each generating a replace address signal for activating a redundant memory location to replace a defective memory cell, comprising:

a program address generation circuit, in response to a test mode signal and an address signal, for generating a program address signal; and a number of anti-fuse unit circuits, each anti-fuse unit circuit connected to said each replace address signal generator and including an anti-fuse element, wherein the anti-fuse unit circuit is selected by the program address signal and the anti-fuse element contained in the selected anti-fuse unit circuit is programmed by using a voltage signal to thereby activate a corresponding replace address generator, wherein the anti-fuse unit circuit further includes:

an anti-fuse selection circuit, in an anti-fuse programming procedure, for programming the anti-fuse element in response to the program address signal and a programming voltage signal, and, in an anti-fuse state reading operation, for generating a state signal in response to the external voltage signal and the power-up signal;

an anti-fuse state evaluation circuit, in the anti-fuse state reading operation, for generating a regulated state signal in response to the external voltage signal and the power-up signal; and a latch circuit for latching the regulated state signal and for generating a latched signal representing the regulated state signal to be coupled to the corresponding replace address signal generator.

2. The integrated circuit as recited in claim 1, wherein the voltage signal includes the programming voltage signal, an external voltage signal and a power-up signal, and further comprising an internal power generator, in response to the test mode signal, for generating the programming voltage signal.

3. The integrated circuit as recited in claim 2, wherein the anti-fuse selection circuit includes:

a switching means, in response to one of the program address and the power-up signal, for providing the external voltage signal to one terminal of the anti-fuse element;

means for providing the programming voltage signal as a negative voltage signal to the other terminal of the anti-fuse element to thereby allow a voltage across two terminals of the anti-fuse element to be a sum of the external voltage signal and the programming voltage signal in the anti-fuse programming procedure; and means for generating a state signal representing a voltage across the terminals of the anti-fuse element in the anti-fuse state reading operation.

4. The integrated circuit as recited in claim 3, wherein the anti-fuse evaluation circuit includes buffer means, in response to the power-up signal, for receiving the state signal to generate a regulated state signal according to the external voltage signal.

5. The integrated circuit as recited in claim 4, wherein the power-up signal includes a first power-up signal, a second power-up signal and a third power-up signal; and wherein the switching means includes:

a first PMOS transistor, in response to the program address, for selectively providing the external voltage signal to said one terminal of the anti-fuse element; and a second PMOS transistor, in response to the first power-up signal, for selectively providing the external voltage signal to said one terminal of the anti-fuse element.

6. The integrated circuit as recited in claim 5, wherein the switching means further includes:

a third PMOS transistor, in response to the third power-up signal, for selectively by-passing the external voltage signal to a ground; and a fourth PMOS transistor connected between the first and second PMOS transistors and said on terminal of the anti-fuse element, the gate of which is coupled to the ground.

7. The integrated circuit as recited in claim 6, wherein the buffer means includes:

a fifth PMOS transistor, in response to the first power-up signal for selectively providing the external voltage signal; and first and second NMOS transistors, each responsive to the second power-up signal and the state signal for providing the external voltage signal according to the state signal as the regulated state signal.

8. The integration circuit as recited in claim 7, wherein the internal power generator includes:

an oscillator, in response to the test mode signal, for generating a clock signal and an inverse clock signal; and a charge pump circuit, in response to the test mode signal and the clock signals, for generating the programming voltage signal.

9. The integration circuit as recited in claim 8, wherein the charge pump circuit includes:

a serial connection of a NMOS transistor, first, second and third diodes, coupled between an output port and the ground, wherein the NMOS transistor is controlled by the test mode signal; and three PMOS transistors, each coupled to the anode of each first, second and third diodes, which are coupled to the clock signal, the inverse clock signal and the ground, respectively.

10. The integration circuit as recited in claim 8, wherein the charge pump circuit includes:

a serial connection of a NMOS transistor, first, second and third diodes, coupled between an external voltage source and an output port, wherein the NMOS transistor is controlled by the test mode signal; and three capacitors, each coupled to the anode of each first, second and third diodes, which are coupled to the clock signal, the inverse clock signal and the ground, respectively.

11. The integrated circuit as recited in claim 10, wherein the capacitor is a finger-shaped stacked-array capacitor.

12. The integrated circuit as recited in claim 11, wherein the diode is formed of triple wells of P-well inserted into N-well formed on P-substrate.

13. The integrated circuit as recited in claim 2, wherein the anti-fuse selection circuit includes:

a switching means, in response to the program address, for providing a ground voltage to one terminal of the anti-fuse element;

means for providing the programming voltage signal to the other terminal of the anti-fuse element to thereby allow a voltage across the terminals of the anti-fuse element to be a programming voltage in the anti-fuse programming procedure; and means for generating a state signal representing a voltage across the terminals of the anti-fuse element in the anti-fuse state reading operation.

14. The integrated circuit as recited in claim 13, wherein the anti-fuse evaluation circuit includes buffer means, in response to the power-up signal, for receiving the state signal to generate a regulated state signal according to the external voltage signal.

15. The integrated circuit as recited in claim 14, wherein the switching means includes an NMOS transistor, in response to the program address, for coupling the ground to the other terminal of the anti-fuse element.

16. The integrated circuit as recited in claim 15, wherein the means for providing the programming voltage signal includes a diode for providing a programming voltage signal to said one terminal of the anti-fuse element.

17. The integrated circuit as recited in claim 16, wherein the power-up signal includes a first power-up signal, a second power-up signal and a third power-up signal; and the buffer means includes:
   a first serial connection of a sixth PMOS transistor, a seventh PMOS transistor and a third NMOS transistor which are controlled by the first power-up signal, the state signal and the second power-up signal, respectively; and
   a second serial connection of an eighth PMOS transistor, a ninth PMOS transistor and a fourth NMOS transistor, wherein the eighth PMOS transistor is controlled by the first power-up signal and the ninth PMOS and fourth NMOS transistors are controlled by an output of the first serial connection.

18. The integrated circuit as recited in claim 17, wherein the buffer means includes a NMOS transistor, in response to the second power-up signal, for providing the state signal to the first serial connection.

19. The integration circuit as recited in claim 18, wherein the NMOS transistor is a hybrid transistor, wherein a source of the hybrid transistor includes a heavily doped N+region and two lightly doped N-regions one of which is overlapped a lower portion of a gate of hybrid transistor; and a drain electrode is coupled through a buffered poly to a drain region.

20. The integration circuit as recited in claim 19, wherein the drain region is formed of N− region and is smaller than the N+ region of the source.

21. The integration circuit as recited in claim 20, wherein the internal power generator includes:
   an oscillator, in response to the test mode signal, for generating a clock signal and an inverse clock signal; and
   a charge pump circuit, in response to the test mode signal and the clock signals, for generating the programming voltage signal.

* * * * *